United States Patent
Damlencourt et al.

(10) Patent No.: US 7,427,779 B2
(45) Date of Patent: Sep. 23, 2008

(54) MICROSTRUCTURE FOR FORMATION OF A SILICON AND GERMANIUM ON INSULATOR SUBSTRATE OF SI1-XGEX TYPE

(75) Inventors: Jean-Francois Damlencourt, Saint Egrève (FR); Rémi Costa, Veynes (FR)

(73) Assignee: Commissariat a l'Energie Atomique, Paris (FR)

( * ) Notice: Subject to any disclaimer, the term of this patent is extended or adjusted under 35 U.S.C. 154(b) by 48 days.

(21) Appl. No.: 11/707,078

(22) Filed: Feb. 16, 2007

(65) Prior Publication Data

US 2007/0205408 A1   Sep. 6, 2007

(30) Foreign Application Priority Data

Mar. 1, 2006   (FR) .................................... 06 01851

(51) Int. Cl.
*H01L 29/04*   (2006.01)
(52) U.S. Cl. ............................... 257/63; 257/19; 257/65
(58) Field of Classification Search .................. 257/19, 257/63, 65
See application file for complete search history.

(56) References Cited

U.S. PATENT DOCUMENTS 5,906,951 A   5/1999   Chu et al.
6,689,211 B1   2/2004   Wu et al.

OTHER PUBLICATIONS

Tezuka T. et al., "Selectively-Formed High Mobility SiGe-on-Insulator pMOSFETs with Ge-rich Strained Surface Channels Using Local Condensation Technique," 2004, Symposium on VLSI Technology: Digest of Technical Papers, pp. 198-199.
Deguet C. et al., "200 MM Germanium-on-Insulator (GEOI) Structures Realized from Epitaxial Wafers Using the Smart Cut Technology," 2005, Acceptance Publication Proceedings ECS 2005 Conference.
Liu Y. et al., "High-Quality Single-Crystal Ge on Insulator by Liquid-Phase Epitaxy on Si Substrates," Apr. 5, 2004, Applied Physics Letters, vol. 84, No. 14, pp. 2563-2565.

(Continued)

*Primary Examiner*—Douglas M Menz
(74) *Attorney, Agent, or Firm*—Oliff & Berridge, PLC

(57) ABSTRACT

The microstructure is designed for formation of a silicon and germanium on insulator substrate of $Si_{1-Xf}Ge_{Xf}$ type, with Xf comprised between a first value that is not zero and 1. The microstructure is formed by stacking of a silicon on insulator substrate and a first initial layer of silicon and germanium alloy of $Si_{1-X1}Ge_{X1}$ type, with X1 strictly comprised between 0 and Xf. The stack also comprises a second initial layer of silicon and germanium alloy of $Si_{1-X2}Ge_{X2}$ type, with X2 comprised between a first value that is not zero and 1, and an intermediate layer, preferably made of silicon oxide or silicon nitride, that is able to remain amorphous during formation of the substrate and that is intercalated between the first initial layer of $Si_{1-X1}Ge_{X1}$ and the second initial layer of $Si_{1-X2}Ge_{X2}$.

9 Claims, 3 Drawing Sheets

OTHER PUBLICATIONS

Tezuka T. et al., "A Novel Fabrication Technique of Ultrathin and Relaxed SiGe Buffer Layers with High Ge Fraction for Sub-100 nm Strained Silicon-on-Insulator MOSFETs," Apr. 2001, Jpn. J. Appl. Phys., vol. 40, pp. 2866-2874.

Paine D.C. et al., "Oxidation of $Si_{1-x}Ge_x$ Alloys at Atmostpheric and Elevated Pressure," Nov. 1, 1991, J. Appl. Phys., vol. 70, No. 9, pp. 5076-5084.

Huang J. et al., "Calculation of Critical Layer Thickness Considering Thermal Strain in $Si_{1-x}Ge_x$/Si Strained-layer Heterostructures," Jan. 1, 1998, J. Appl. Phys., vol. 83, No. 1, pp. 171-173.

Nakaharai S. et al., "Characterization of 7-nm-thick Strained Ge-on-insulator Layer Fabricated by Ge-condensation Technique," Oct. 27, 2003, Applied Physics Letters, vol. 83, No. 17, pp. 3516-3518.

Gao F. et al., "High Germanium Content Strained SGOI by Oxidation of Amorphous SiGe Film on SOI Substrates," 2005, Electrochemical and Solid-State Letters, vol. 8, No. 12, pp. G337-G340.

MICROSTRUCTURE FOR FORMATION OF A SILICON AND GERMANIUM ON INSULATOR SUBSTRATE OF SI1-XGEX TYPE

BACKGROUND OF THE INVENTION

The invention relates to a microstructure designed for formation of a silicon and germanium on insulator substrate of $Si_{1-Xf}Ge_{Xf}$ type, with Xf comprised between a first value that is not zero and 1, and formed by stacking of a silicon on insulator substrate and a first initial layer of silicon and germanium alloy of $Si_{1-X1}Ge_{X1}$ type, with X1 strictly comprised between 0 and Xf.

STATE OF THE ART

The current silicon-based microelectronics technology is reaching the limits of the possibilities offered by this material. The growing need for electronic devices with better and better performances, at higher and higher speeds and with an increasingly lower power consumption has led to new solutions being studied.

The microelectronics industry then turned to germanium, which is fully compatible with the technology developed for silicon and which presents the same crystalline structure as silicon, but with better properties in terms of charge carrier mobility.

A particular application concerns pMOSFETs (p-type metal-oxide-semiconductor field-effect transistors). The article "Selectively-formed high mobility SiGe-On-Insulator pMOSFETs with Ge-rich strained surface channels using local condensation technique" by T. Tezuka et al. (2004 IEEE Symposium on VLSI Technology Digest of technical papers) in particular describes fabrication of a pMOSFET the improved performances whereof can in particular be felt for charge carrier depleted transistors (FD pMOSFET) made from germanium.

To fabricate Germanium-On-Insulator (GOI or GeOI) substrates, a first technique uses the Smart Cut™ technology, initially developed for fabrication of Silicon-On-Insulator (SOI) substrates, described in particular in the article "200 mm Germanium-On-Insulator (GeOI) structures realized from epitaxial wafers using the Smart Cut™ technology" by C. Deguet et al. (Proceedings ECS 2005, Quebec). This technology is based on transfer, onto a silicon substrate, of a germanium layer deposited on a silicon oxide layer $SiO_2$ forming an insulating layer. The GOI substrate obtained in this way is of the full wafer type. However, this technology presents a very high cost and nMOSFET transistors are very difficult to achieve.

A second technology is based on the lateral recrystallization principle, in particular described in the article "High-quality single-crystal Ge on insulator by liquid-phase epitaxy on Si substrates" by Y. Liu et al. (Applied Physics Letters, vol.84, n°14, Apr. 5, 2004), enabling a localized GOI substrate to be produced. The technique consists in depositing a nitride layer locally on a standard silicon substrate, which layer will form the insulator, and in then depositing a larger layer of germanium thereon, which layer will then be locally in contact with the silicon substrate. Once encapsulated, the stack is heated briefly to the melting temperature of germanium and is then cooled. Solidification of the molten germanium is initiated on the silicon of the substrate (monocrystalline seed), and the front then propagates locally forming a monocrystalline germanium on insulator layer. However, this technique for fabricating localized GOI substrates is unwieldy, due to interface stability problems, and recrystallization is limited both in extent and in geometry.

A third known fabrication technique uses the germanium condensation technique, also enabling localized GOI substrates to be obtained. This technique is based on the total miscibility of germanium and silicon (same crystalline structure) and on the difference of chemical affinities between germanium and silicon with respect to oxygen, highlighted in particular in the article "A novel Fabrication Technique of Ultrathin and Relaxed SiGe Buffer Layers with High Ge Fraction for Sub-100 nm Strained Silicon-On-Insulator MOSFETs" by T. Tezuka et al. (Jpn. J. Appl. Phys. Vol. 40 (2001) pp. 2866-2874 Part1, No. 4B, April 2001).

The article "Characterization of 7-nm-thick strained Ge-on-insulator layer fabricated by Ge-condensation technique" by S. Nakaharai et al. (Applied Physics Letters, vol. 83, n°17, Oct. 27, 2003) in particular describes the fabrication principle of a SGOI or GOI substrate by germanium condensation.

As represented schematically in FIGS. 1 and 2, a microstructure 1 formed by stacking of a SOI substrate 2 and a layer 3 of silicon and germanium alloy of $Si_{1-X1}Ge_{X1}$ type (FIG. 1) is designed to form a substrate 4 comprising a final layer 5 of silicon and germanium alloy of $Si_{1-Xf}Ge_{Xf}$ type (FIG. 2).

The SOI substrate 2 of the initial microstructure 1 comprises a layer 6 of silicon oxide $SiO_2$ buried between two silicon layers, a thick layer 7 and a thin layer 8, whereon the initial $Si_{1-X1}Ge_{X1}$ layer 3 is deposited. The final germanium concentration Xf in the layer 5 of the substrate 4 is comprised between a first value that is not zero and 1, and the initial germanium concentration X1 in the layer 3 of the microstructure 1 is strictly comprised between 0 and the final germanium concentration Xf in the layer 5 of the substrate 4.

The condensation germanium method consists in performing a thermal oxidation treatment, preferably at high temperature, of the silicon of the stack of layers of the initial microstructure 1. As silicon has a better chemical affinity to oxygen, the germanium is not oxidized. As represented in FIG. 2, thermal oxidation then results in consumption of the silicon of the whole of the stack of the SOI substrate 2 and of the $Si_{1-X1}Ge_{X1}$ layer 3 to form a top layer 9 of $SiO_2$, located on top of the substrate 4 (FIG. 2). The thin silicon layer 8 of the SOI substrate 2, initially arranged between the $Si_{1-X1}Ge_{X1}$ layer 3 and the buried $SiO_2$ layer 6 of the microstructure 1, has been consumed during thermal oxidation and has migrated to the top layer 9 of $SiO_2$.

In FIG. 2, as germanium is not soluble in $SiO_2$, the germanium-enriched layer 5 has been rejected against the buried $SiO_2$ layer 6 and then presents a smaller final thickness Ef than the initial thickness E1 of the $Si_{1-X1}Ge_{X1}$ layer 3.

As described in the article "Oxidation of $Si_{1-X}Ge_X$ alloys at atmospheric and elevated pressure" by D. C. Paine et al. (J. Appl. Phys. 70(9), Nov. 1, 1991), the germanium condensation process can continue until the silicon has been completely consumed so as to obtain a layer 5 containing germanium only, then forming a GOI substrate 4 with a final germanium concentration Xf equal to 1. In the case where the silicon is not completely consumed, the substrate 4 is then a SGOI substrate with a final germanium concentration Xf of the layer 5 strictly comprised between 0 and 1.

However, a major problem of this germanium condensation technique for fabrication of a substrate 4 comprising a $Si_{1-Xf}Ge_{Xf}$ layer 5 is relaxation of the strains in the germanium-enriched final layer 5. When oxidation of the $Si_{1-X1}Ge_{X1}$ layer 3 of the microstructure 1 takes place, there is competition between silicon oxidation and germanium diffusion. A strong composition gradient can lead to a strained local state, such that the layer 5 relaxes plastically. This then results in the appearance of criss-cross dislocation lattices in the layer 5, resulting in particular in poor quality of the substrate 4.

Moreover, the germanium condensation technique can be used both for thick layers, i.e. larger than 1 μm and than the critical relaxation thickness Ec, as described in the article "Calculation of critical layer thickness considering thermal strain in $Si_{1-x}Ge_x$/Si strained-layer heterostructures" by Jingyun Huang et al. (J. Apply. Phys. 83 (1), 1 Jan. 1998), or for thin layers, i.e. smaller than the critical relaxation thickness Ec.

However, to finally obtain a thick GOI or SGOI substrate, condensation of germanium from thick layers assumes long oxidation times, as a decrease of the oxidation rate is observed in relation to the thickness of the $SiO_2$ layer 9 formed on the substrate 4. Moreover, the initial microstructure 1 is preferably achieved by metamorphic growth, which results in the presence of dislocations in the stack of these layers, which are then plastically relaxed.

Furthermore, starting from a relatively thin layer 3 of $Si_{1-X1}Ge_{X1}$, the layer 3 is consumed when condensation takes place and the layer 5 obtained is then relatively thin. For example, starting from a layer of $Si_{1-X1}Ge_{X1}$ with an initial germanium concentration X1 of 10% (X1=0.1) and an initial thickness E1 of 100 nm, a GOI substrate 4 with a final thickness Ef of the layer 5 of about 10 nm can be obtained.

However, from a technological point of view, it is very difficult to form components on so thin a GOI substrate 4. Thickening of the layer 5 is therefore necessary, with all the problems this can give rise to, in particular fragility of the interface between the germanium layer 5 and the buried $SiO_2$ layer 6 and the difficulty of obtaining a monocrystalline material by epitaxy on so thin a germanium on insulator layer. In addition, the surface on which epitaxy is performed always has to be clean. The melting point of germanium is however very low, which makes it impossible to perform high-temperature treatment enabling the surface to be cleaned.

The article "High Germanium Content Strained SGOI by Oxidation of Amorphous SiGe Film on SOI Substrates" by F. Gao et al. (Electrochemical and Solid-State Letters, 8 (12) G337-G340 (2005)) further describes a particular method for fabricating a substrate by germanium condensation consisting in depositing an amorphous layer of silicon and germanium alloy directly on the SOI substrate. However, the silicon and germanium alloy layer is deposited directly on the SOI substrate and recrystallized when high-temperature oxidation treatment of the microstructure is performed. This then results in a substrate being obtained that does not present optimum characteristics in terms of strain and that presents defects from a crystalline point of view.

OBJECT OF THE INVENTION

It is one object of the invention to remedy all the above-mentioned shortcomings and to provide a microstructure designed for formation of a silicon and germanium on insulator substrate of $Si_{1-Xf}Ge_{Xf}$ type that is thick and presents optimum mechanical properties.

According to the invention, this object is achieved by a microstructure according to the accompanying claims, and more particularly by the fact that the microstructure comprises a second initial layer of silicon and germanium alloy of $Si_{1-X2}Ge_{X2}$ type, with X2 comprised between a first value that is not zero and 1, and an intermediate layer that is able to remain amorphous during formation of the substrate and that is formed between the first initial layer of silicon and germanium alloy of $Si_{1-X1}Ge_{X1}$ type and the second initial layer of silicon and germanium alloy of $Si_{1-X2}Ge_{X2}$ type.

It is a further object of the invention to use one such microstructure more particularly for fabrication of a SGOI or GOI substrate by the germanium condensation technique.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
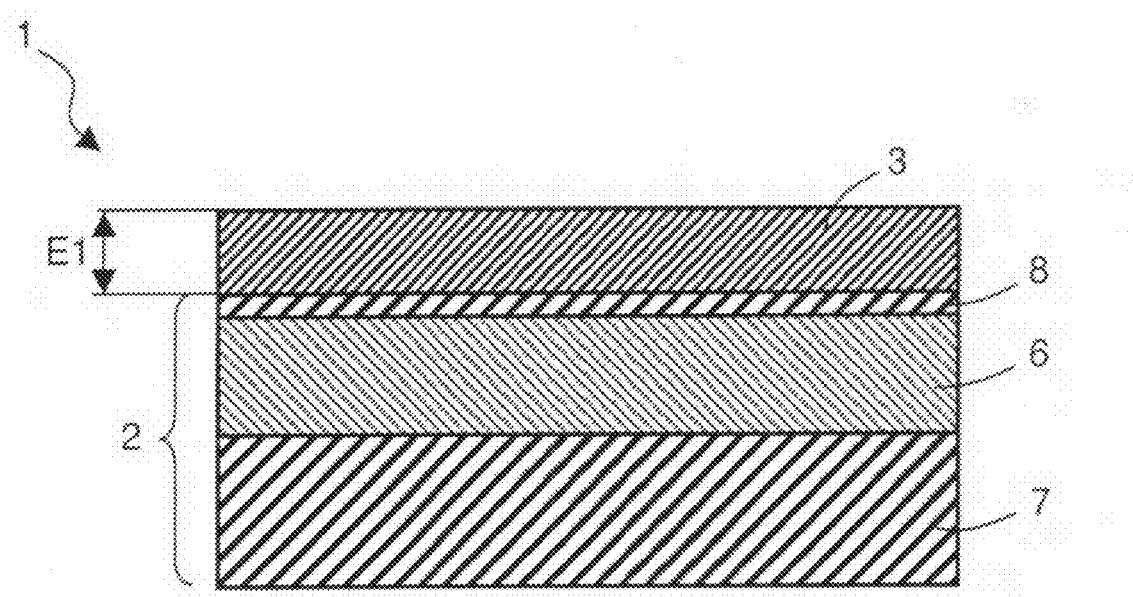
FIG. 1 schematically represents a cross-sectional view of a microstructure according to the prior art designed for formation of a silicon and germanium on insulator substrate of $Si_{1-Xf}Ge_{Xf}$ type.
Figure 2:
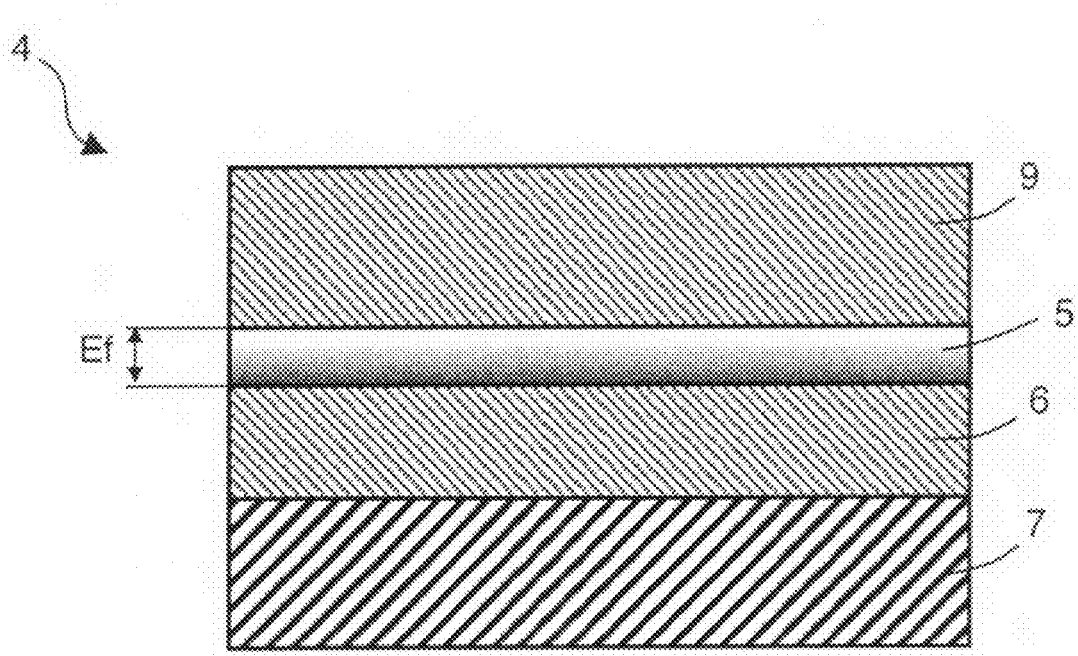
FIG. 2 schematically represents a cross-sectional view of the substrate obtained by germanium condensation from the microstructure according to FIG. 1.
Figure 3:
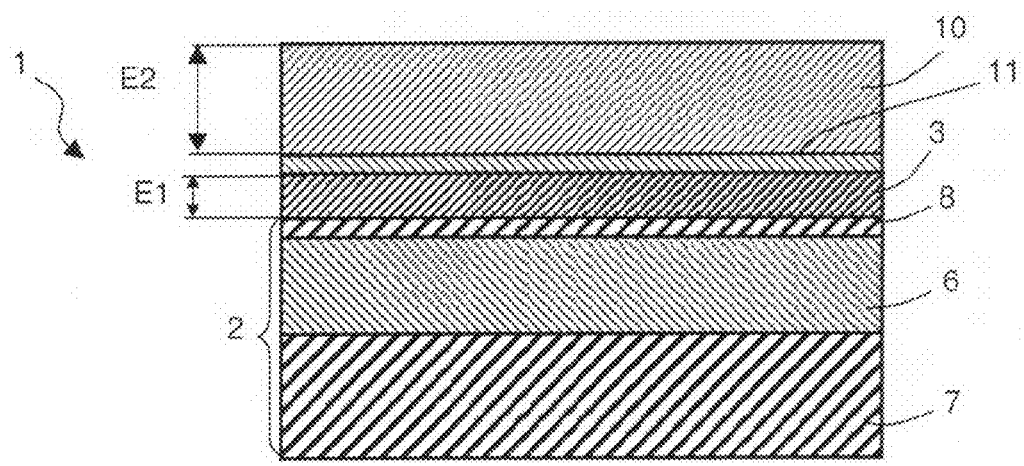
FIG. 3 schematically represents a cross-sectional view of a microstructure according to the invention designed for formation of a silicon and germanium on insulator substrate of $Si_{1-Xf}Ge_{Xf}$ type.

In FIG. 3, the microstructure 1 is formed by stacking of a SOI substrate 2 and of a first initial layer 3 made of silicon and germanium alloy of $Si_{1-X1}Ge_{X1}$ type. The $Si_{1-X1}Ge_{X1}$ layer 3 is preferably pseudomorphous, i.e. with a smaller thickness E1 than the critical plastic relaxation thickness.

The microstructure 1 comprises a second initial layer 10 made from silicon and germanium alloy of $Si_{1-X2}Ge_{X2}$ type, with X2 comprised between a first value that is not zero and 1. The germanium concentration X2 of the second initial layer 10 is preferably different from the germanium concentration X1 of the first initial layer 3.

In the case where the concentration X2 is equal to 1, the second initial layer 10 is made of pure germanium and, in the case where the concentration X2 is strictly comprised between 0 and 1, the second initial layer 10 is made of silicon and germanium alloy.

The $Si_{1-X2}Ge_{X2}$ layer 10 is preferably amorphous or polycrystalline and presents a thickness E2 that is preferably larger than the thickness E1 of the first initial layer 3 of $Si_{1-X1}Ge_{X1}$. In a general manner, to prevent dislocations from occurring in the microstructure 1, the $Si_{1-X2}Ge_{X2}$ layer 10 is non-monocrystalline, so that the $Si_{1-X2}Ge_{X2}$ layer 10 does not have to be taken into account in the critical plastic relaxation thickness of the microstructure 1.

The microstructure 1 is designed to act as initial structure for formation of a thick substrate 4 (FIG. 5) comprising a final layer 5 of silicon and germanium alloy of $Si_{1-Xf}Ge_{Xf}$ type. The microstructure 1 is more particularly designed to form a substrate 4 the final thickness Ef of the $Si_{1-Xf}Ge_{Xf}$ layer 5 whereof is greater than the initial thickness E1 of the $Si_{1-X1}Ge_{X1}$ layer 3 (FIGS. 3 and 5).

The initial germanium concentration X1 in the first $Si_{1-X1}Ge_{X1}$ layer 3 is preferably strictly comprised between 0 and Xf. The final germanium concentration Xf is strictly comprised between 0 and 1 for a SGOI substrate 4, and the final germanium concentration Xf is equal to 1 for a GOI substrate 4.

Figure 4:
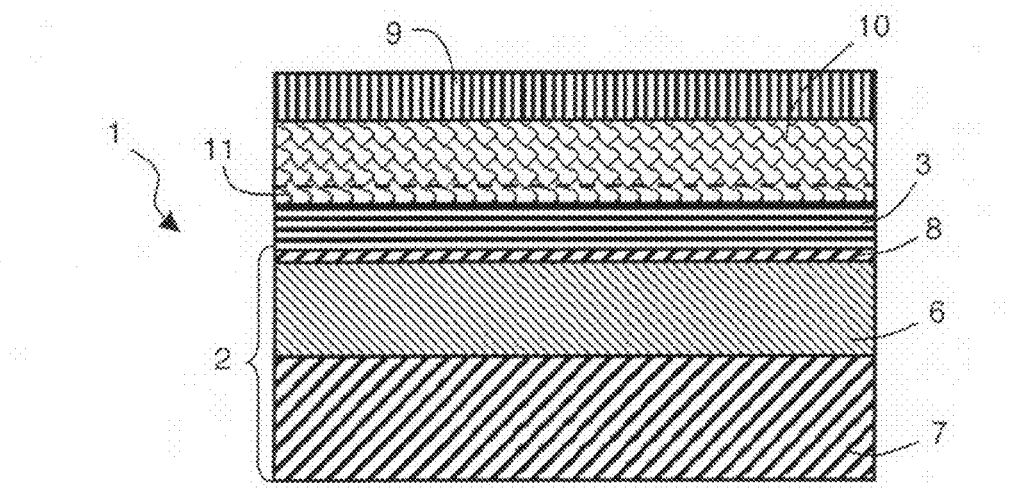
FIG. 4 schematically represents a cross-sectional view of an intermediate step of a method for germanium condensation from the microstructure according to FIG. 3 to form a silicon and germanium on insulator substrate of $Si_{1-Xf}Ge_{Xf}$ type.
Figure 5:
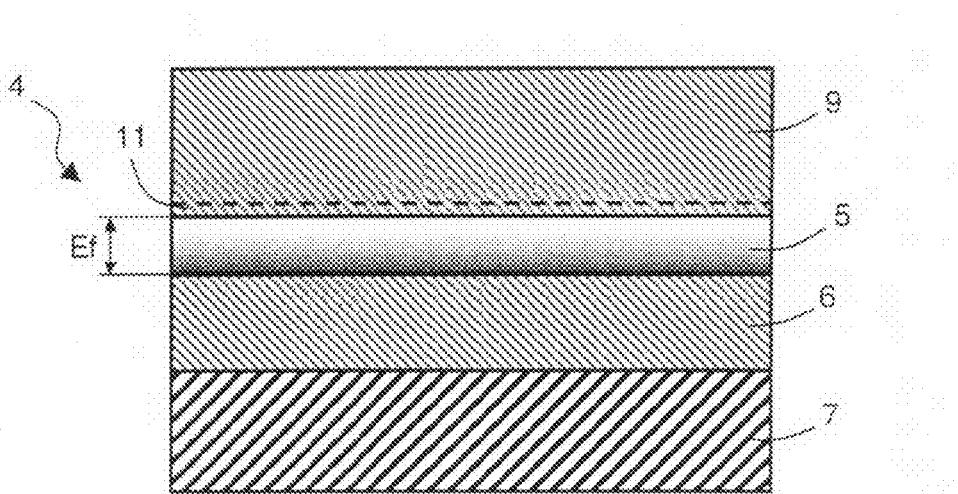
FIG. 5 schematically represents a cross-sectional view of the substrate obtained by germanium condensation from the microstructure according to FIG. 3.

The microstructure 1 is more particularly designed to be used as initial structure in a germanium condensation method enabling a substrate 4 to be produced with a thick layer 5 of $Si_{1-X1}Ge_{Xf}$, the main steps of which method are represented in FIGS. 4 and 5.

In the particular embodiment represented in FIG. 3, the microstructure 1 also comprises an intermediate layer 11 formed between the first initial layer 3 of $Si_{1-X1}Ge_{X1}$ and the second initial layer 10 of $Si_{1-X2}Ge_{X2}$. The intermediate layer 11 has to be sufficiently thick, in particular to enable deposition of the second initial layer 10, and sufficiently thin, in particular to enable diffusion of the germanium atoms in the case of use of the microstructure 1 to form a substrate 4 by a germanium condensation method. The intermediate layer 11 has for example a thickness ranging from a few angstroms to a few nanometers.

The intermediate layer 11 is preferably able to remain amorphous during formation of the substrate 4, in particular when high-temperature thermal oxidation treatment of the germanium condensation method is performed. The intermediate layer 11 in particular enables crystallization of the second initial layer 10 of $Si_{1-X2}Ge_{X2}$ to be prevented during the temperature increase inherent to the thermal oxidation step of the germanium condensation method. The second initial layer 10 of $Si_{1-X2}Ge_{X2}$ thus remains amorphous or polycrystalline during formation of the substrate 4.

In the particular embodiment of FIG. 3, the intermediate layer 11 is made of silicon oxide $SiO_2$. The oxide of the intermediate layer 11 can be formed by chemical means (ozone bath+hydrochloric acid; sulfuric acid) or by thermal means (oxygen, water vapor, water vapor+hydrochloric acid; temperature about 800° C. to 1100° C.). The oxide of the intermediate layer 11 can be native, i.e. naturally formed, or be deposited, i.e. by direct deposition of a layer, for example, of silicon oxide $SiO_2$.

In the particular embodiment of FIGS. 3 to 5, the germanium condensation technique consists in performing thermal oxidation, preferably at high temperature, of all the layers 2, 3, 10 and 11 of the stack constituting the initial microstructure 1 (FIG. 3). As represented in FIG. 4, during the thermal oxidation step, the silicon of the second initial layer 10 of $Si_{1-X2}Ge_{X2}$ and of the intermediate layer 11 of $SiO_2$ is oxidized, and the germanium atoms are diffused to the first initial layer 3 of $Si_{1-X1}Ge_{X1}$.

The silicon of the thin layer 8 of the SOI substrate 2, of the first layer 3 of $Si_{1-X1}Ge_{X1}$ and of the second layer 10 of $Si_{1-X2}Ge_{X2}$ migrates to the top of the stack of layers and starts to form the top layer 9 of silicon oxide $SiO_2$ on the top of the stack (FIG. 4).

The thickness of the thin layer 8 of silicon and of the second initial layer 10 of the microstructure 1 decrease and the thickness of the $SiO_2$ layer 9 formed on the top of the stack increases in the course of the thermal oxidation treatment. The germanium condensation process continues so long as the required final germanium concentration Xf of the layer 5 of the substrate 4 has not been reached.

As represented in FIG. 5, at the end of the germanium condensation treatment, the germanium-enriched layer 5 of the substrate 4 thus obtained is either made of pure germanium, if complete consumption of the silicon takes place, or of silicon and germanium alloy, if consumption of the silicon is incomplete. The substrate 4 comprises the $Si_{1-Xf}Ge_{Xf}$ layer 5 rejected against the buried $SiO_2$ layer 6, and the top layer 9 of $SiO_2$ formed on the top of the final layer 5 and comprising the $SiO_2$ layer 11 which has remained amorphous during formation of the substrate 4. The final thickness Ef of the $Si_{1-Xf}Ge_{Xf}$ layer 5, which is greater than the thickness E1 of the initial $Si_{1-X1}Ge_{X1}$ layer 3 of the microstructure 1, is relatively thick, in particular to enable formation of components on the top of the substrate 4.

The second initial layer 10 of $Si_{1-X2}Ge_{X2}$ of the microstructure 1 (FIG. 3) thus acted as germanium reservoir, resulting in a faster enrichment of the layer 5 of the substrate 4 and resulting in a very thick layer 5 being obtained, avoiding any additional thickening step.

For example, considering there is total conservation of the germanium atoms during the germanium condensation treatment, the following equation can be written: X1.E1+X2.E2=Xf.Ef A microstructure 1 according to the prior art, with a germanium concentration X1 of about 10% (X1=0.1) and a thickness E1 of the $Si_{1-X1}Ge_{X1}$ layer 3 of about 100 nm, thus enables a GOI substrate 4 to be achieved with a layer 5 of pure germanium, i.e. with a concentration Xf of 100% (Xf=1), having a thickness Ef of about 10 nm.

A microstructure 1 according to the invention, with the same first initial layer 3 and with the second initial layer 10, with a germanium concentration X2 of about 30% (X2=0.3) and a thickness E2 of about 100 nm, enables a GOI substrate 4 to be achieved with a layer 5 of pure germanium, i.e. with a concentration Xf of 100% (Xf=1), having a final thickness Ef of about 40 nm. The final layer 5 obtained is therefore four times thicker than the initial layer 3 of the initial microstructure 1, using a microstructure 1 according to the invention.

Such a microstructure 1 with an additional initial layer 10 in the stack of layers of the microstructure 1, in particular for producing a substrate 4 by germanium condensation, therefore enables a thick SGOI or GOI substrate 4 to be achieved directly after germanium condensation. The layer 5 is relatively thick and presents optimum characteristics in terms of germanium enrichment.

Moreover, the presence of the intermediate layer 11 enables crystallization of the second layer 10 to be prevented during the germanium condensation method. This results in a substrate 4 being obtained that presents optimum characteristics in terms of mechanical properties, in particular a substrate 4 presenting no crystalline defects.

Figure 6:
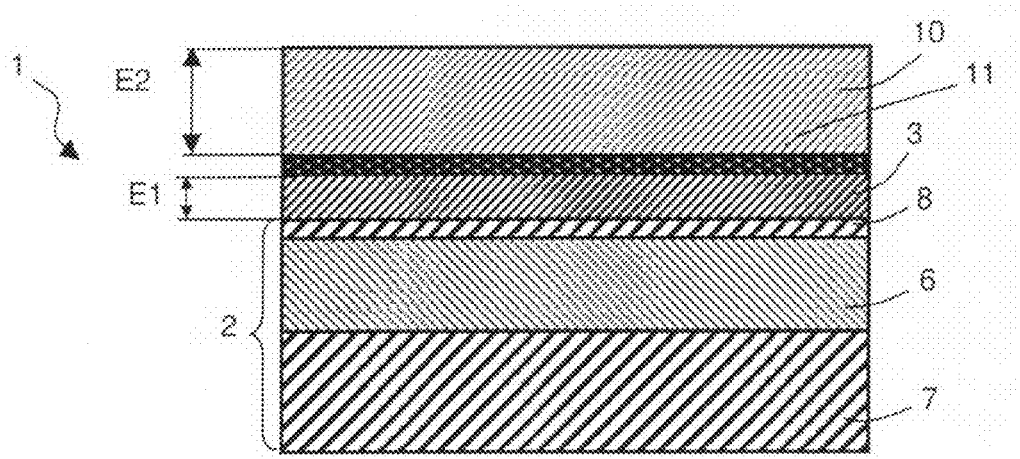
FIG. 6 schematically represents a cross-sectional view of an alternative embodiment of a microstructure according to the invention designed for formation of a silicon and germanium on insulator substrate of $Si_{1-Xf}Ge_{Xf}$ type.
Figure 7:
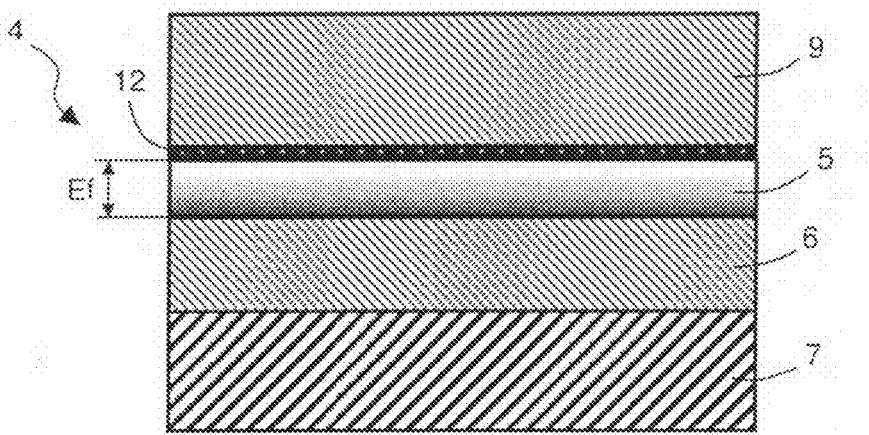
FIG. 7 schematically represents a cross-sectional view of the substrate obtained by germanium condensation from the microstructure according to FIG. 6.

The alternative embodiment of the microstructure 1 represented in FIG. 6 differs from the embodiment of FIG. 3 by the intermediate layer 11 made of silicon nitride $Si_3N_4$. In the case of formation of a substrate 4 by a germanium condensation method, as represented in FIG. 7, a residual layer 12 of silicon oxynitride then remains, at the end of the treatment step, between the germanium-enriched final layer 5 and the top layer 9 of $SiO_2$ formed after germanium condensation. Depending on the applications, this residual layer 12 is then eliminated, for example during the final process of fabricating a component from the substrate 4 thus formed.

Figure 8:
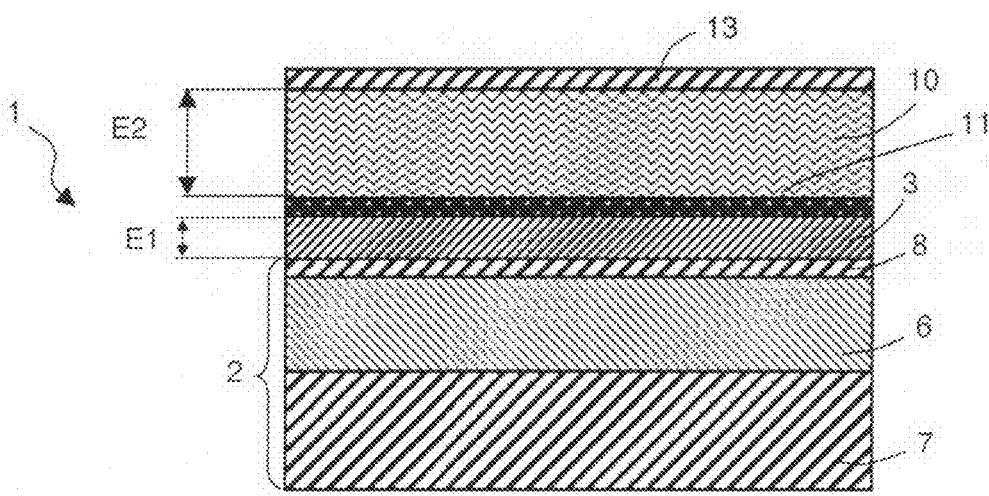
FIG. 8 schematically represents a cross-sectional view of another alternative embodiment of a microstructure according to the invention designed for formation of a silicon and germanium on insulator substrate of $Si_{1-Xf}Ge_{Xf}$ type.

In FIG. 8, the alternative embodiment of the microstructure 1 differs from the embodiments represented in FIGS. 3 and 6 by stacking of an additional layer 13 of silicon formed on the second initial layer 10 of $Si_{1-X2}Ge_{X2}$ of the microstructure 1. The additional silicon layer 13 is in particular deposited before any thermal oxidation treatment, in the case where the microstructure 1 is used for a germanium condensation treatment.

The additional silicon layer 13, with a thickness ranging for example from a few angstroms to a few nanometers, is preferably amorphous or polycrystalline, and serves the purpose in particular of forming a thin layer of $SiO_2$ on the top of the microstructure 1 preventing consumption of germanium during the thermal oxidation step of the germanium condensation process.

Whatever the embodiment of the microstructure 1 described above, such a microstructure 1 in particular enables a GOI or SGOI substrate 4 to be fabricated presenting optimum characteristics in terms of germanium concentration and enrichment, in terms of layer thickness and in terms of mechanical properties.

The presence of a second initial layer 10 in the initial microstructure 1, in particular when the microstructure 1 is used to form a substrate 4 by germanium condensation, enables the germanium enrichment to be speeded up and a substrate 4 to be obtained with better qualities. The second initial layer 10 also enables any additional thickening step of the substrate 4 to be avoided. Furthermore, the intermediate layer 11 in particular enables crystallization of the layer 10 to be prevented, which layer remains amorphous or polycrystalline during formation of the substrate 4.

Furthermore, the first initial layer 3, which is thin and pseudomorphous, in particular enables the presence of dislocations in the stack of layers of such a microstructure 1 to be prevented.

The invention is not limited to the different embodiments described above. The values of the germanium concentration and of the layer thicknesses are not restrictive and depend on the required initial and final characteristics of the microstructure 1 and of the substrate 4.

The invention claimed is:

1. Microstructure designed for formation of a silicon and germanium on insulator substrate of $Si_{1-Xf}Ge_{Xf}$ type, with Xf comprised between a first value that is not zero and 1, and formed by stacking of
   a silicon on insulator substrate,
   a first initial layer of silicon and germanium alloy of $Si_{1-X1}Ge_{X1}$ type, with X1 strictly comprised between 0 and Xf,
   an intermediate layer that is able to remain amorphous during formation of the silicon and germanium on insulator substrate, and
   a second initial layer of silicon and germanium alloy of $Si_{1-X2}Ge_{X2}$ type, with X2 comprised between a first value that is not zero and 1.

2. Microstructure according to claim 1, wherein the intermediate layer is made of silicon oxide.

3. Microstructure according to claim 1, wherein the intermediate layer is made of silicon nitride.

4. Microstructure according to claim 1, wherein the thickness of the intermediate layer ranges from a few angstroms to a few nanometers.

5. Microstructure according to claim 1, wherein the first initial layer of $Si_{1-X1}Ge_{X1}$ silicon and germanium alloy is pseudomorphous.

6. Microstructure according to claim 1, wherein the second initial layer of $Si_{1-X2}Ge_{X2}$ silicon and germanium alloy is amorphous.

7. Microstructure according to claim 1, wherein the second initial layer of $Si_{1-X2}Ge_{X2}$ silicon and germanium alloy is polycrystalline.

8. Microstructure according to claim 1, comprising an additional silicon layer deposited on the second initial layer of $Si_{1-X2}Ge_{X2}$ silicon and germanium alloy.

9. A method for fabrication of a thick silicon and germanium on insulator substrate of $Si_{1-Xf}Ge_{Xf}$ type comprising germanium condensation on a microstructure according to claim 1.

* * * * *